United States Patent [19]

Mattuschka

[11] 4,188,557
[45] Feb. 12, 1980

[54] PIEZOELECTRIC OVERTONE RESONATOR WITH AT LEAST A CONVEX SURFACE AND SPECIFIC THICKNESS AND DIAMETER OR DIAGONAL

[75] Inventor: Werner Mattuschka, Munich, Fed. Rep. of Germany

[73] Assignee: Siemens Aktiengesellschaft, Berlin & Munich, Fed. Rep. of Germany

[21] Appl. No.: 962,384

[22] Filed: Nov. 20, 1978

[30] Foreign Application Priority Data

Nov. 25, 1977 [DE] Fed. Rep. of Germany ....... 2752734

[51] Int. Cl.² ............................................ H01L 41/10
[52] U.S. Cl. ..................................... 310/368; 310/369
[58] Field of Search ............................. 310/367–369, 310/360, 361; 333/186

[56] References Cited

U.S. PATENT DOCUMENTS

| 3,979,614 | 9/1976 | Toyoda ............................ 310/369 X |
| 4,114,062 | 9/1978 | Mattuschka ........................ 310/369 |
| 4,124,809 | 11/1978 | Engdahl et al. ................. 310/368 X |

*Primary Examiner*—Mark O. Budd
*Attorney, Agent, or Firm*—Hill, Van Santen, Steadman, Chiara & Simpson

[57] ABSTRACT

In the use of a resonator as an overtone crystal of an aperiodic oscillator circuit without additional selection means, by dimensioning of the resonator itself and its electrodes, suppression particularly of the fifth harmonic during operation of the resonator with the third harmonic is improved by means of special resonator dimensions.

6 Claims, 4 Drawing Figures

PIEZOELECTRIC OVERTONE RESONATOR WITH AT LEAST A CONVEX SURFACE AND SPECIFIC THICKNESS AND DIAMETER OR DIAGONAL

BACKGROUND OF THE INVENTION

The invention relates to a thickness shear crystal used as an overtone resonator for a quartz stabilized oscillator in the MHz range, whereby use of the resonator intended for cooperation with an essentially aperiodic oscillator circuit has been made possible without additional frequency selection means by employing specified dimension ratios of the resonator.

A resonator of this type is known from U.S. Pat. No. 4,114,062. This resonator can be operated, without additional selection means, together with an aperiodic oscillator circuit—constructed particularly in integrated circuit technology—either with the third or fifth harmonic of the resonator fundamental frequency. Therefore, in each instance, the fundamental oscillator and the third harmonic are satisfactorily suppressed during operation with the fifth harmonic, or the fundamental oscillation and the fifth harmonic are satisfactorily suppressed during operation with the third harmonic through specified dimensions of the resonator itself and its excitation electrodes.

If, however, the desired operating frequency of the resonator and the oscillator circuit lies for the third overtone of a thickness shear crystal in the relatively low frequency range of approximately 10 to 25 MHz, for example, it may result in certain applications that there is an inadequate suppression of the fifth harmonic due particularly to the integrated circuit.

SUMMARY OF THE INVENTION

Accordingly, it is an object of the invention to further develop a resonator of the type initially cited such that an even better suppression of the fundamental tone and of the undesired harmonic can be guaranteed.

In accordance with the invention, this object is achieved by virtue of the fact that the resonator, constructed in the form of a plano-convex or biconvex disk, is provided with a maximum resonator thickness in millimeters of approximately (n·1700)/f, whereby f is the operating frequency in kHz and n is the ordinal number of the desired harmonic, that the radius of the convex curvature of the resonator in millimeters, in the case of a resonator provided with a plano-convex construction, is approximately 140 to 180 times the reciprocal value of the maximum resonator thickness. In the case of a resonator provided with a biconvex construction, the radius is approximately 280 to 360 times said reciprocal value, and that in the case of a substantially circular disk-shaped resonator configuration, the resonator diameter and, in the case of an essentially rectangular resonator configuration, the rectangular diagonal is dimensioned to be equal approximately to (54 to 72/n) times the maximum resonator thickness.

Further embodiments of the invention provide that the diameter of the excitation electrodes arranged opposite one another concentrically relative to the center of the disk on the two large surfaces of the resonator corresponds approximately to 0.4 to 0.5 times the diameter in the case of a substantially circular disk-shaped resonator, or corresponds approximately to 0.4 to 0.5 times the diagonals in the case of a substantially rectangular resonator. The mass of the excitation electrodes is determined by a relative frequency difference between the resonator without electrodes and the resonator provided with the excitation electrodes, of approximately $\Delta f/f = (4 \text{ to } 5) \cdot 10^{-3}$, where f is the operating frequency of the resonator.

DESCRIPTION OF THE PREFERRED EMBODIMENTS

Figure 1:
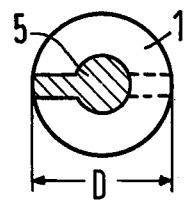
FIG. 1 illustrates in schematic form a circular disk-shaped plano-convex resonator.
Figure 1:
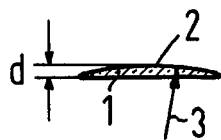
Figure 2:
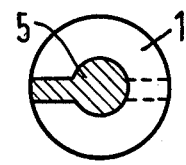
FIG. 2 illustrates in schematic form a circular disk-shaped biconvex resonator.
Figure 2:
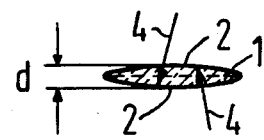
Figure 3:
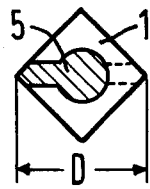
FIG. 3 illustrates in schematic form a square resonator.
Figure 3:
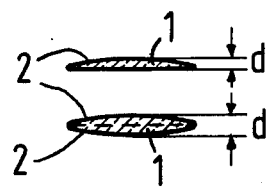
Figure 4:
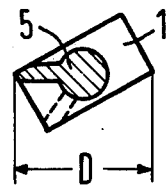
FIG. 4 illustrates in schematic form a rectangular resonator which, as in the case of FIG. 3, is provided either with a plano-convex or biconvex construction.
Figure 4:
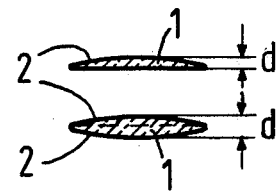

In detail, it can be learned from the Figures that, in the case of either the circular disk-shaped resonator or square or rectangular resonators 1, at least one of the two large surfaces 2 is curved in a lenticular fashion. The area of maximum thickness, accordingly, is therefore located in the center of the resonator. This maximum thickness d is to have, in millimeters, the value of (n·1700)/f, whereby, instead of f, the desired operating frequency in kHz is to be set, and n is the ordinal number of the selected harmonic. This results e.g., given an operating frequency of 20 MHz and an operation of the resonator with the third harmonic (n=3), in a maximum resonator thickness of approximately 0.25 mm. The diameter D of the resonator, in the case of a circular disk-shaped construction of the resonator, is to be selected approximately (54 to 72)/n times as great as the maximum thickness of the resonator. There thus results a resonator diameter D, at an operating frequency of 20 MHz in the third overtone, of approximately 5 mm, whereby, as the multiplier, the value 60/3=20 has been selected. In the case of a square or rectangular resonator format, the diagonal D is likewise to be dimensioned (54 to 72)/n times as great as the maximum thickness of the resonator.

The resonator can be provided either in a plano-convex form i.e. with a half-lens, or in a biconvex form—i.e., with a lenticular cross section. In the case of a plano-convex design of the resonator, the lens radius 3 is to be dimensioned such that its value results from the multiplication of the reciprocal maximum thickness of the resonator with a numerical value lying between 140 and 180. Accordingly, a thickness shear crystal for the operating frequency of 20 MHz, given a maximum thickness of 0.25 mm and a diameter of 5 mm in the case of a plano-convex construction of the resonator, is to be provided with a lens radius 3 of approximately 600 mm, whereby the value 150 has been used as the multiplier. In the case of a likewise biconvex design (i.e., lenticular design of the resonator) the double value of lens radius 3 is to be set for lens radii 4. There thus results for lens radii 4, in the case of a biconvex resonator, a value of 1200 mm. Similar values for lens radius 3 or lens radii 4 respectively, are also to be selected in the case of a square or rectangular design of the resonator.

In order to even further improve the selectivity of the resonator with regard to the desired third harmonic, for example, the diameter of the excitation electrodes 5, provided concentrically relative to the resonator center and which for all resonator formats are provided with a circular construction, is to be selected approximately equal to 0.4 to 0.5 times D—i.e., the resonator diameter or the resonator diagonal. In the case of a resonator diameter of 5 mm, accordingly, the excitation electrodes are to be provided with a diameter of approximately 2.5 mm.

The electrode mass, i.e. the quantity of conductive material to be vapor-deposited on the resonator for the formation of the electrodes, or, in any case, to be applied onto the latter, is to be selected such that the still uncoated, i.e. bare resonator, manifests an oscillation frequency greater approximately by $\Delta f = (4 \text{ to } 5) \cdot 10^{-3} \cdot f$ than the desired operating frequency f. With an operating frequency of 20 MHz, the bare resonator is thus to be dimensioned during fine machining such that it oscillates with a frequency of f=20,080 to 20,100 MHz. This oscillation frequency is then to be reduced by a coating or vapor deposition of the resonator with electrode material which is carried out for such a length of time until the desired operating frequency of 20 MHz has been obtained.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A thickness shear crystal overtone resonator for use in a quartz stabilized oscillator in the MHz range and wherein the resonator is used in cooperation with an essentially aperiodic oscillator circuit without additional frequency selection means through specified dimension ratios of the resonator, comprising: a thin plate-like crystal having a convex surface and an opposed plane surface; the resonator having a maximum resonator thickness in millimeters of approximately (n·1700)/f where f is an operating frequency in kHz and n is an ordinal number of a desired harmonic; a radius of the convex surface of the resonator in millimeters being approximately 140 to 180 times a reciprocal value of said maximum resonator thickness; and the resonator diameter in the case of an essentially circular disk-shaped resonator and the rectangular diagonal in the case of an essentially rectangular resonator being dimensioned to be equal approximately to (54 to 72)/n times said maximum resonator thickness.

2. The overtone resonator according to claim 1 characterized in that excitation electrodes are provided arranged oppositely one another concentrically relative to the resonator center on the opposed surfaces of the resonator, a diameter of the electrodes corresponding approximately to 0.4 and to 0.5 times the diameter in the case of the substantially circular disk-shaped resonator and the diagonal in the case of the substantially rectangular resonator.

3. An overtone resonator according to claim 2 characterized in that the mass of the excitation electrodes placed on a bare resonator is specified by a relative frequency difference between the bare resonator without electrodes and the resonator provided with the excitation electrodes of approximately $\Delta f/f = (4 \text{ to } 5) \cdot 10^{-3}$ where f is the operating frequency of the resonator.

4. A thickess shear crystal overtone resonator for use in a quartz stabilized oscillator in the MHz range and wherein the resonator is used in cooperation with an essentially aperiodic oscillator circuit without additional frequency selection means through specified dimension ratios of the resonator, comprising: a thin plate-like crystal having two opposed convex surfaces; the resonator having a maximum resonator thickness in millimeters of approximately (n·1700)/f where f is an operating frequency in kHz and n is an ordinal number of a desired harmonic; a radius of the convex surfaces of the resonator being approximately 280 to 360 times a reciprocal value of said maximum resonator thickness; and the resonator diameter in the case of an essentially circular disk-shaped resonator and the rectangular diagonal in the case of an essentially rectangular resonator being dimensioned to be equal approximately to (54 to 72)/n times said maximum resonator thickness.

5. The overtone resonator according to claim 4 characterized in that excitation electrodes are provided arranged oppositely one another concentrically relative to the resonator center on the opposed surfaces of the resonator, a diameter of the electrodes corresponding approximately to 0.4 to 0.5 times the diameter in the case of the substantially circular disk-shaped resonator and the diagonal in the case of the substantially rectangular resonator.

6. An overtone resonator according to claim 5 characterized in that the mass of the excitation electrodes placed on a bare resonator is specified by a relative frequency difference between the bare resonator without electrodes and the resonator provided with the excitation electrodes of approximately $\Delta f/f = (4 \text{ to } 5) \cdot 10^{-3}$ where f is the operating frequency of the resonator.

* * * * *